US006975158B2

(12) United States Patent
Sekimoto

(10) Patent No.: US 6,975,158 B2
(45) Date of Patent: Dec. 13, 2005

(54) NOISE CANCELING CIRCUIT

(75) Inventor: Yasuhiko Sekimoto, Hamakita (JP)

(73) Assignee: Yamaha Corporation, Hamamatsu (JP)

( * ) Notice: Subject to any disclaimer, the term of this patent is extended or adjusted under 35 U.S.C. 154(b) by 66 days.

(21) Appl. No.: 10/780,158

(22) Filed: Feb. 17, 2004

(65) Prior Publication Data

US 2004/0189376 A1 Sep. 30, 2004

(30) Foreign Application Priority Data

Feb. 17, 2003 (JP) .......................... P.2003-038414

(51) Int. Cl.[7] .............................................. H03K 17/16
(52) U.S. Cl. ...................................... 327/379; 327/558
(58) Field of Search .......................... 327/34, 310–311, 327/379, 551–552, 555, 558

(56) References Cited

U.S. PATENT DOCUMENTS 3,728,556 A 4/1973 Arnell
3,993,047 A * 11/1976 Peek .......................... 600/479
4,305,042 A * 12/1981 Tanaka et al. .............. 327/317
4,524,389 A * 6/1985 Isobe et al. ................. 348/725
4,772,964 A * 9/1988 Kaida .......................... 360/67
4,789,838 A * 12/1988 Cheng ......................... 327/31
5,136,386 A * 8/1992 Okada et al. ............... 348/622
5,222,002 A * 6/1993 Hase et al. ................... 360/46
5,499,302 A * 3/1996 Nagami et al. ............ 381/71.4
5,852,521 A * 12/1998 Umeyama et al. ............ 360/46
6,118,878 A * 9/2000 Jones .......................... 381/72
6,172,516 B1 1/2001 Han et al.
6,335,656 B1 * 1/2002 Goldfarb et al. ............ 327/559
6,507,220 B1 * 1/2003 Groen et al. .................. 326/93
6,873,838 B2 * 3/2005 Mapes ........................ 455/336

FOREIGN PATENT DOCUMENTS

| | | |
|---|---|---|
| CN | 1247413 | 3/2000 |
| JP | 58048523 | 3/1983 |
| JP | 58073228 | 5/1983 |
| JP | 59172826 | 9/1984 |

OTHER PUBLICATIONS

Chinese Patent Office, "Office Action," Apr. 1, 2005.

* cited by examiner

*Primary Examiner*—Timothy P. Callahan
*Assistant Examiner*—Cassandra Cox
(74) *Attorney, Agent, or Firm*—Pillsbury Winthrop Shaw Pittman LLP

(57) ABSTRACT

A low-pass filter eliminates a high-frequency component contained in an input signal. An inverter outputs a signal at a high level or a low level in response to an output of the low-pass filter that is larger or smaller than a threshold level. A one-shot pulse generating circuit outputs a pulse signal at a point of time when an output level of the inverter is changed. FETs receive the pulse signal output from the one-shot pulse generating circuit, and pulls in forcedly the output of the low-pass filter to the high level or the low level. According to this pulling-in operation, generation of the noise at an output terminal can be prevented.

8 Claims, 5 Drawing Sheets

FIG. 1
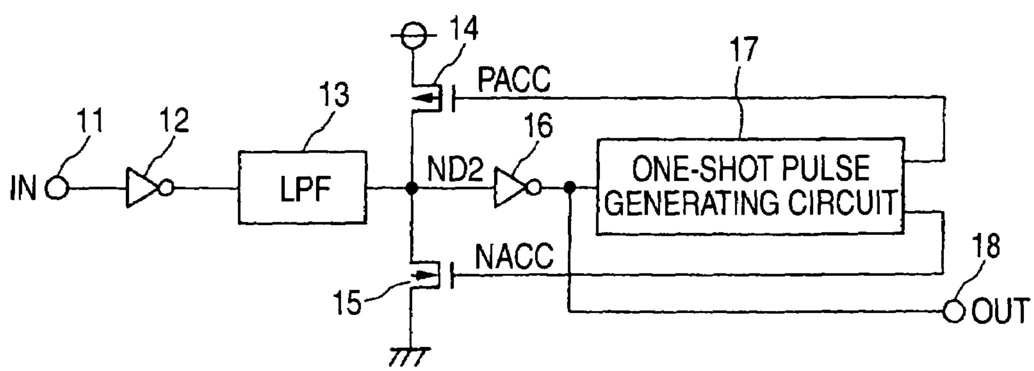
FIG. 2A
FIG. 2B
FIG. 2C
FIG. 2D
FIG. 2E
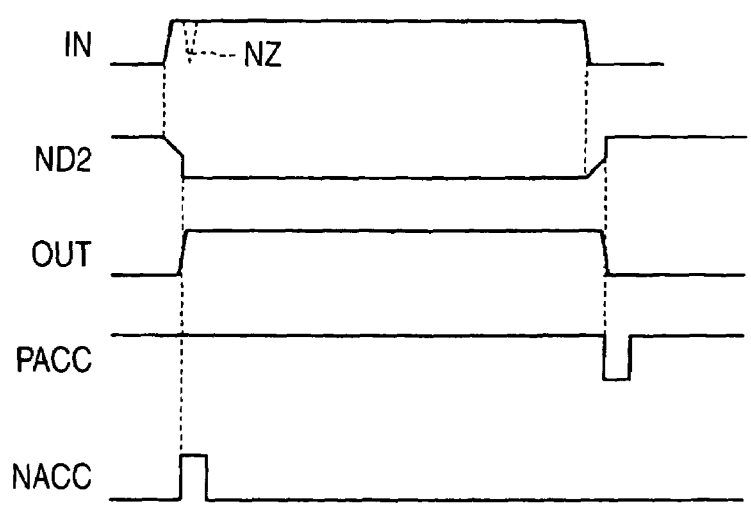

FIG. 4A
FIG. 4B
FIG. 4C
FIG. 4D
FIG. 4E
FIG. 4F
FIG. 4G
FIG. 4H
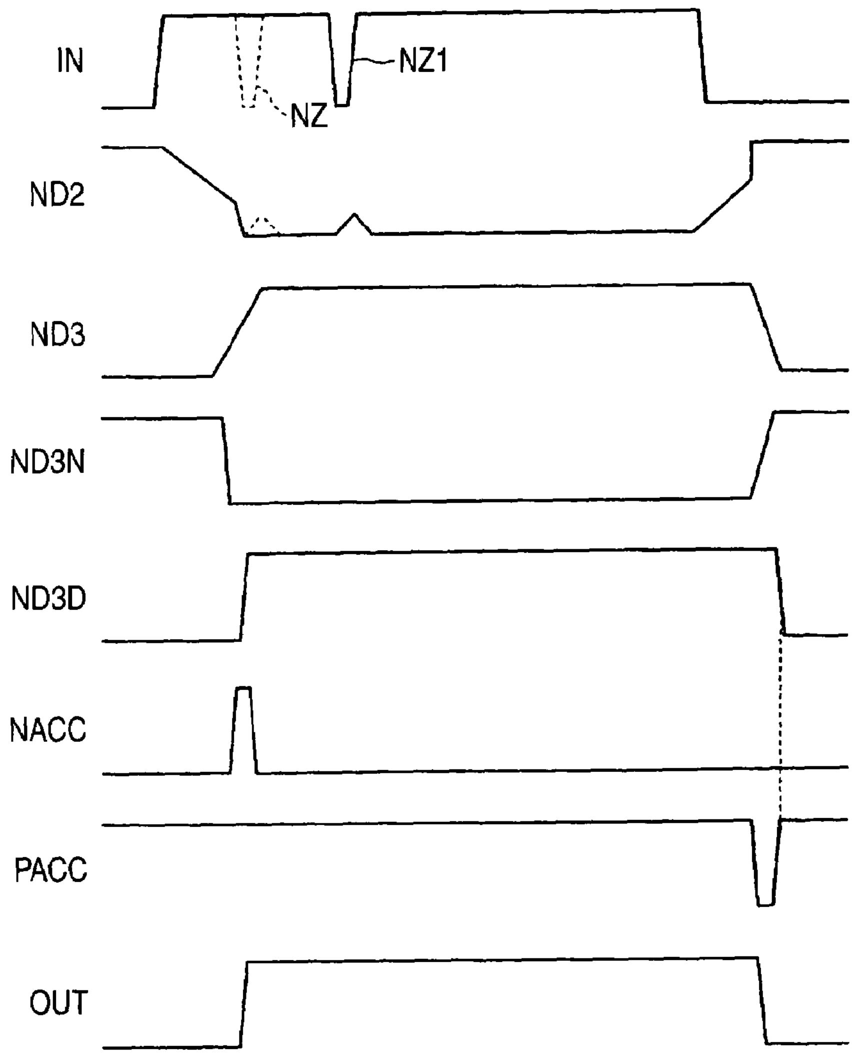
FIG. 5
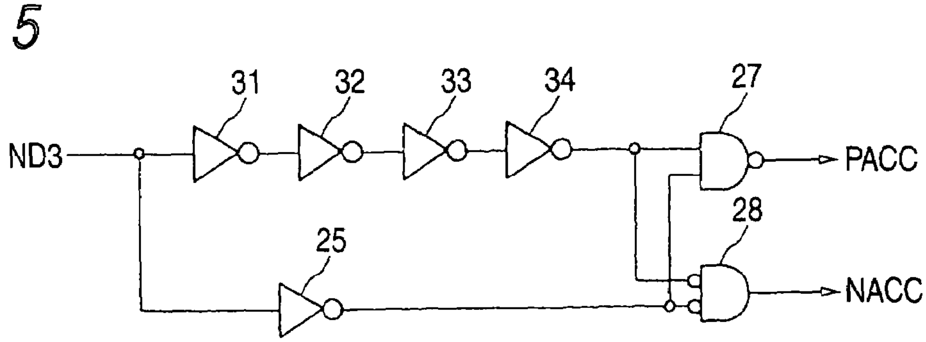

PRIOR ART
FIG. 6
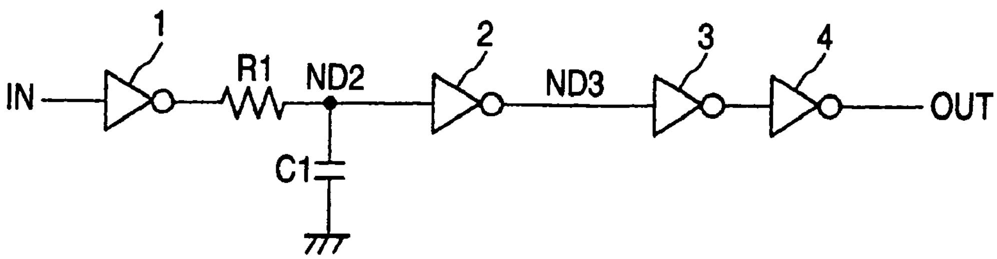
PRIOR ART
FIG. 7A
FIG. 7B
FIG. 7C
FIG. 7D
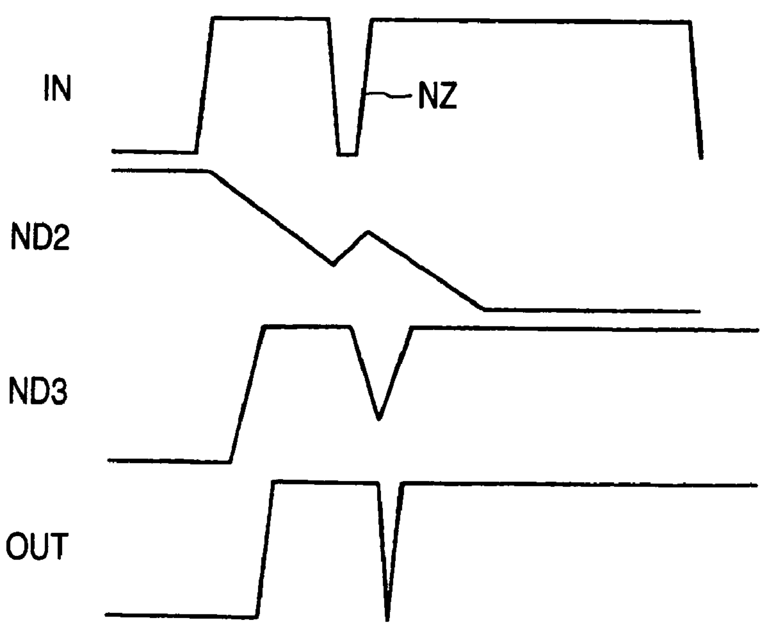

NOISE CANCELING CIRCUIT

BACKGROUND OF THE INVENTION

The present invention relates to a noise canceling circuit for canceling a noise that enters into a clock input terminal, or the like, irrespective of a variation in production.

FIG. 6 is a circuit diagram showing a configurative example of a noise canceling circuit using an RC filter in the prior art. In FIG. 6, reference numerals 1 to 4 are inverters, R1 is a resistor, and C1 is a capacitor. Now, when a signal IN containing a noise NZ shown in FIG. 7A is input into an input terminal, a signal ND2 at a connection point between the resistor R1 and the capacitor C1 appears as shown in FIG. 7B and an output signal ND3 of the inverter 2 and an output signal OUT of the inverter 4 appear as shown in FIGS. 7C and 7D, respectively. As apparent from this Figure, if a width of the noise NZ exceeds a predetermined value, such noise cannot be absorbed by an RC filter and the noise appears on the output signal OUT. This can be improved by constructing the inverter 2 as a Schmidt circuit.

FIGS. 8A to 8D are operating waveform diagrams when the Schmidt circuit is used. The output signal ND2 of the RC filter is given as shown by a thin line in FIGS. 8B to 8D in response to the input signal IN containing the noise NZ shown in FIG. 8A, and the output signal OUT is given as shown by a thick line in the same Figure in response to threshold levels VIL, VIH of the Schmidt circuit. In other words, if the threshold levels VIL is low, the output signal OUT rises later regardless of the noise NZ, as shown in FIG. 8B. If both the threshold levels VIL, VIH are higher than those in the case of FIG. 8B, the output signal OUT rises when the signal ND2 crosses the threshold levels VIL, as shown in FIG. 8C. In this manner, if the Schmidt circuit is used, the influence of the noise can also be suppressed by the Schmidt circuit. However, if the threshold levels VIL is relatively high and the threshold levels VIH is low, it is possible that the noise responding to the noise NZ appears in the output signal OUT, as shown in FIG. 8D.

Patent Literature 1 discloses the circuit in which the hysteresis input circuit is implemented by the internal circuit without the external circuit and the noise is canceled by this hysteresis input circuit. However, even though the hysteresis characteristic is provided to the input circuit, in some cases the noise cannot be canceled according to the type of the noise. In the circuit disclosed in Patent Literature 2, the hysteresis characteristic is provided to the input circuit and also the delay characteristic is provided to the feedback loop by applying the positive feedback from the output end to the input end. However, this circuit can cancel the narrow noise, but such circuit has such a shortcoming that it cannot cancel the noise whose width is in excess of a predetermined value.

Patent Literature 3 discloses the noise canceling circuit in which the input stage is constructed by the Schmidt circuit with the hysteresis characteristic. However, this circuit has such a shortcoming that it does not operate when the input signal does not have a width that is in excess of a predetermined value.

Patent Literature 1

JP-B-3-30323

Patent Literature 2

JP-A-59-172826

Patent Literature 3

JP-B-1-29094

SUMMARY OF THE INVENTION

The present invention has been made in view of the above circumstances and an object of the present invention is to provide a noise canceling circuit capable of canceling a noise without fail in both cases a width of the noise is wide and the width of the noise is narrow, and capable of operating surely when a pulse width of an input signal is narrow.

In order to solve the aforesaid object, the invention is characterized by having the following arrangement.

(1) A noise canceling circuit comprising:

a low-pass filter for eliminating a high-frequency component contained in an input signal;

an amplifying unit which outputs a signal at either high or low level in response to an output of the low-pass filter that is larger or smaller than a threshold level;

a pulse generating circuit for outputting a pulse signal at a point of time when an output level of the amplifying unit is changed; and a pulling-in circuit for receiving the pulse signal output from the pulse generating circuit, and forcibly pulling the output of the low-pass filter in the high level or the low level.

(2) The noise canceling circuit according to (1), wherein the pulling-in circuit includes a first transistor interposed between the output of the low-pass filter and a terminal for the high level and a second transistor interposed between the output of the low-pass filter and a terminal for the low level, and an output of the pulse generating circuit is supplied to control terminals of the first and second transistors.

(3) The noise canceling circuit according to (1) or (2), wherein the pulse generating circuit includes a delay circuit for delaying an output of the amplifying unit, an inverting circuit for inverting the output of the amplifying unit, an AND circuit for calculating a logical product between the delay circuit and the inverting circuit, and an OR circuit for calculating a logical sum between the delay circuit and the inverting circuit.

(4) The noise canceling circuit according to any one of (1) to (3), wherein the amplifying unit includes a Schmidt circuit.

BRIEF DESCRIPTION OF THE DRAWINGS

FIG. 1 is a block diagram showing a configuration of a noise canceling circuit according to an embodiment of the present invention.

FIGS. 2A to 2E are waveform diagrams explaining an operation of the embodiment.

FIGS. 4A to 4H are waveform diagrams explaining an operation of the same example.

FIG. 5 is a circuit diagram showing another configurative example of a delay circuit in the same example.

FIG. 6 is a circuit diagram showing a configurative example of a noise canceling circuit in the prior art.

FIGS. 7A to 7D are waveform diagrams explaining an operation of the circuit shown in FIG. 6.

DETAILED DESCRIPTION OF PREFERRED EMBODIMENTS

Figure 3:
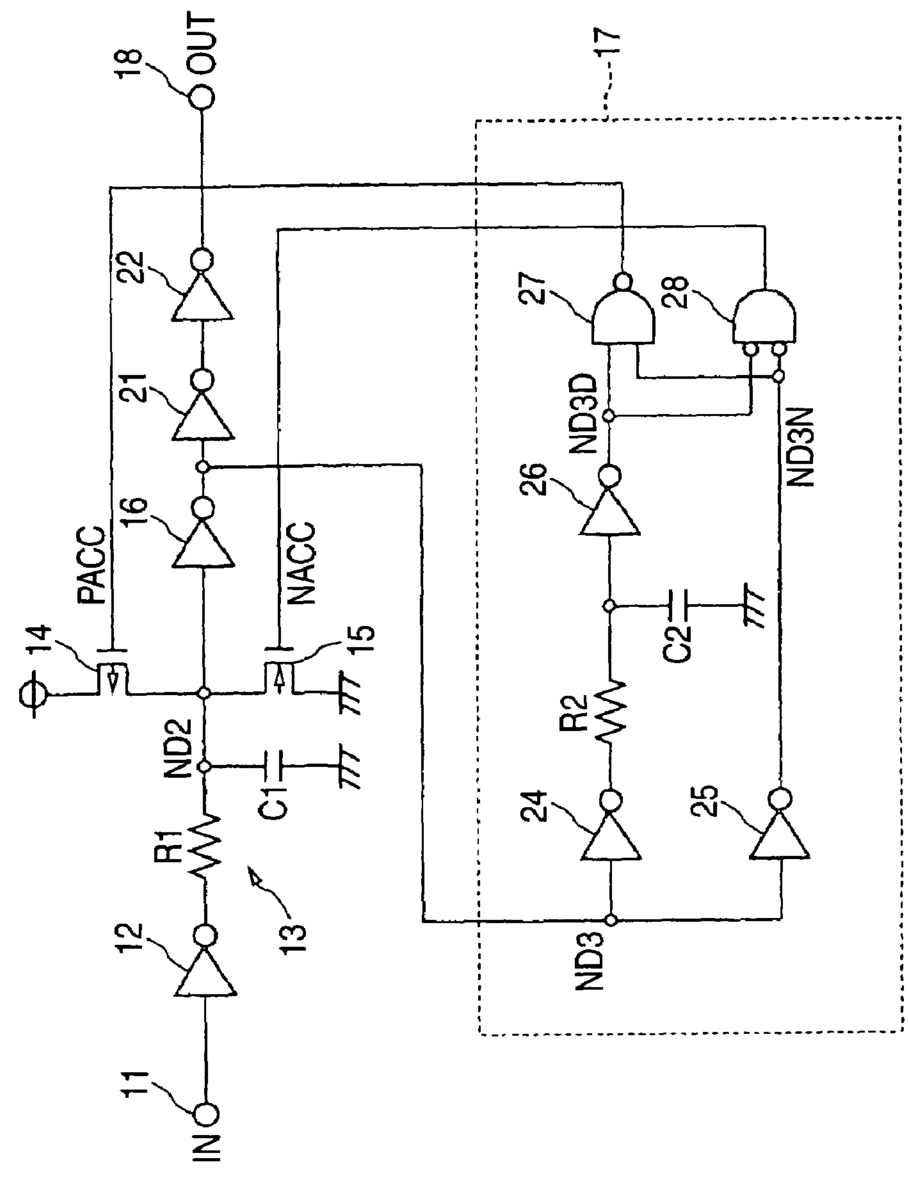
FIG. 3 is a circuit diagram showing a particular example of the embodiment shown in FIG. 1.
Figure 8A:
FIG. 8A to 8D are waveform diagrams explaining an operation when an inverter 2 is constructed by a Schmidt circuit in the circuit shown in FIG. 6.
Figure 8B:
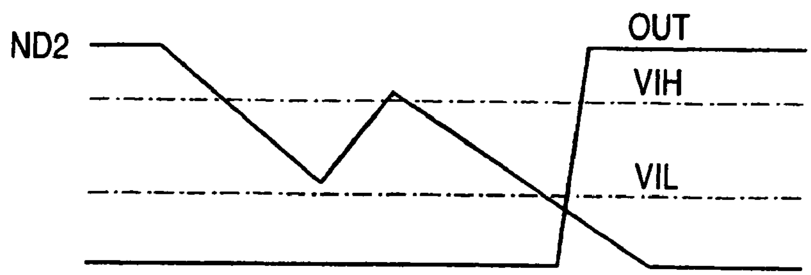
Figure 8C:
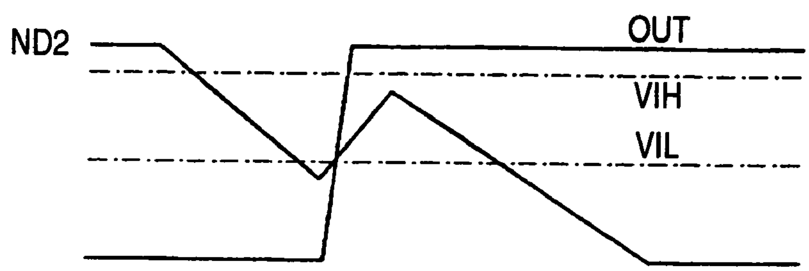
Figure 8D:
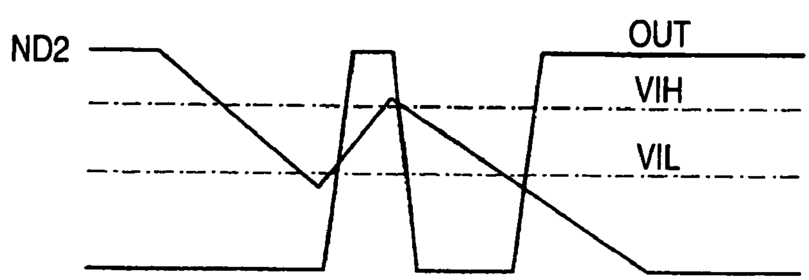

An embodiment of the present invention will be explained with reference to the drawings hereinafter. FIG. 1 is a block diagram showing a configuration of a noise canceling circuit according to an embodiment of the present invention. In FIG. 1, 11 is an input terminal into which an input signal IN is input, 12 is an inverter for inverting the input signal IN to output, and 13 is a low-pass filter for eliminating a high-frequency component of an output of the inverter 12. An output of this low-pass filter 13 is supplied to a connection point between a drain of a P-channel FET (Field Effect Transistor) 14 and a drain of an N-channel FET 15 and an input end of an inverter 16. A source of the FET 14 is connected to a power supply voltage and a source of the FET 15 is grounded. An output of the inverter 16 is supplied to an input end of a one-shot pulse generating circuit 17 and is supplied to an output terminal 18. The one-shot pulse generating circuit 17 generates an "H"-level pulse signal NACC having a predetermined width in response to a leading edge of an output signal (i.e., the signal OUT of the output terminal 18) of the inverter 16 and outputs it to a gate of the FET 15. The one-shot pulse generating circuit 17 generates an "L"-level pulse signal PACC having a predetermined width in response to a trailing edge of the output signal of the inverter 16 and outputs it to a gate of the FET 14.

Next, an operation of the above circuit will be explained with reference to a timing chart shown in FIG. 2 hereunder.

When the input signal IN at the input terminal 11 rises to the "H" level, as shown in FIG. 2A, the output of the inverter 12 falls and accordingly an output ND2 of the low-pass filter 13 falls gradually, as shown in FIG. 2B. Then, when the output ND2 of the low-pass filter 13 falls to an inversion level of the inverter 16, the output of the inverter 16, i.e., the output signal OUT of the output terminal 18 rises to the "H" level, as shown in FIG. 2C. When the signal OUT rises to the "H" level, the "H"-level pulse signal NACC (FIG. 2E) output from the one-shot pulse generating circuit 17 is supplied to the gate of the FET 15. As a result, the FET 15 is turned ON and thus the output signal ND2 of the low-pass filter 13 is pulled down forcedly to the "L" level (ground level). At this time, the signal PACC (FIG. 2D) is at the "H" level, and the FET 14 is in its OFF state. The signal NACC returns to the "L" level after a predetermined time. Accordingly, the FET 15 is turned OFF, but the "L" level state of the signal ND2 is still continued.

During above operations, even though the noise NZ shown in FIG. 2A is contained in the input signal IN, this noise NZ is absorbed by the pulse signal NACC and therefore the noise is in no means generated in the output signal OUT.

Then, when the input signal IN falls, the output ND2 of the low-pass filter 13 rises gradually. Then, when such output ND2 rises to the inversion level of the inverter 16, the output signal OUT of the inverter 16 falls to the "L" level, as shown in FIG. 2C. Then, when such signal OUT falls, the "L"-level pulse signal PACC (FIG. 2D) is output from the one-shot pulse generating circuit 17 and supplied to the gate of the FET 14. Accordingly, the FET 14 is turned ON and the output signal ND2 of the low-pass filter 13 is pulled up forcedly to the "H" level.

Next, a particular example of the above embodiment will be explained with reference to FIG. 3 hereunder. In FIG. 3, the same symbols are affixed to the same portions as respective portions in FIG. 1.

In the example in FIG. 3, the low-pass filter 13 in FIG. 1 consists of a resistor R1 and a capacitor C1, inverters 21, 22 are inserted between the inverter 16 and the output terminal 18, and the one-shot pulse generating circuit 17 is composed of inverters 24 to 26, a resistor R2, a capacitor C2, a NAND gate 27 and a low-active AND gate 28. In this case, the inverter 24 inverts an output signal ND3 of the inverter 16 and supplies an inverted signal to a delay circuit consisting of the resistor R2 and the capacitor C2. An output of the delay circuit is supplied to respective first input terminals of the NAND gate 27 and the low-active AND gate 28 via the inverter 26.

The inverter 24, the resistor R2, the capacitor C2, and the inverter 26, mentioned above, constitute the delay circuit. The signal ND3 is delayed by a predetermined time decided by the resistor R2 and the capacitor C2 and then is supplied to respective first input terminals of the NAND gate 27 and the low-active AND gate 28 as a signal ND3D. The inverter 25 inverts the signal ND3D and supplies the inverted signal to respective second input terminals of the NAND gate 27 and the low-active AND gate 28. An output of the NAND gate 27 and an output of the low-active AND gate 28 are supplied to the gates of the FETs 14 and 15 as the pulse signals PACC and NACC respectively.

Next, an operation of the above circuit will be explained with reference to a timing chart shown in FIG. 4 hereunder.

When the input signal IN of the input terminal 11 rises to the "H" level, as shown in FIG. 4A, the output ND2 of the low-pass filter 13 falls gradually, as shown in FIG. 4B. Then, when the output ND2 of the low-pass filter 13 falls to the inversion level of the inverter 16, the output signal ND3 of the inverter 16 rises to the "H" level, as shown in FIG. 4C. Then, when the signal ND3 rises to the "H" level, an output signal ND3N of the inverter 25 falls (FIG. 4D). The signal ND3D of the inverter 26 rises after such signal is delayed for a predetermined time from the leading edge of the signal ND3 (FIG. 4(E)).

The output signal NACC of the low-active AND gate 28 (FIG. 4F) rises to the "H" level after the signal ND3N falls but before the signal ND3D rises, and then the output signal NACC returns to the "L" level when the signal ND3D rises. In other words, the pulse signal NACC is output from the one-shot pulse generating circuit 17 at the same time when the signal ND3 rises, and then supplied to the gate of the FET 15. Accordingly, the FET 15 is turned ON and thus the output signal ND2 of the low-pass filter 13 is pulled down forcedly to the "L" level (ground level) side.

During above operations, even if the noise NZ shown in FIG. 4A is contained in the input signal IN, this noise NZ is absorbed by the pulse signal NACC and therefore the noise is in no way generated in the output signal OUT (FIG. 4H). Also, even if a noise NZ1 is generated later, such noise is absorbed by the low-pass filter 13 and thus no noise is generated in the output signal OUT.

Then, when the input signal IN falls, the output ND2 of the low-pass filter 13 rises gradually. Then, when the output ND2 rises to the inversion level of the inverter 16, the output signal ND3 of the inverter 16 falls to the "L" level, as shown in FIG. 4C. Then, when the signal ND3 falls, the output signal ND3N of the inverter 25 rises (FIG. 4D). The output signal ND3D of the inverter 26 falls after such signal is delayed for a predetermined time from the trailing edge of the signal ND3 (FIG. 4E).

The output signal PACC of the NAND gate 27 (FIG. 4G) falls to the "L" level after the signal ND3N rises but before the signal ND3D falls, and then the signal PACC returns to the "H" level when the signal ND3D falls. In other words, the pulse signal PACC is output from the one-shot pulse generating circuit 17 at the same time when the signal ND3 falls, and then supplied to the gate of the FET 14. Accordingly, the FET 14 is turned ON and thus the output signal ND2 of the low-pass filter 13 is pulled up forcedly to the "H" level side.

In this case, in the above example, the delay circuit is constructed by the inverter 24, the resister R2, the capacitor C2, and the inverter 26. As shown in FIG. 5, the delay circuit may be constructed by a series-connected circuit of inverters 31 to 34 may be constructed in place of this circuit.

Bipolar transistors may be employed instead of the FETs 14, 15 in the above example.

In the circuit in FIG. 1 and FIG. 3, the well-known Schmidt circuit may be employed in place of the inverter 16. In such case, the circuit configuration is improved such that, even if the larger noise is applied and change in amplitude of the ND2 is caused more largely, the noise is not transmitted to the ND3.

As described above, according to the present invention, the noise can be canceled without fail in both cases a width of the noise is wide and the width of the noise is narrow. For example, the noise having a very narrow width like 5 nsec can be canceled in contrast to a clock pulse whose period is 40 μsec. According to the present invention, there can be achieved the advantage that the noise canceling circuit can operate surely when a pulse width of an input signal is narrow.

What is claimed is:

1. A noise canceling circuit comprising:

a low-pass filter for eliminating a high-frequency component contained in an input signal;

an amplifying unit which outputs a signal at either high or low level in response to an output of the low-pass filter that is larger or smaller than a threshold level;

a pulse generating circuit for outputting a pulse signal at a point of time when an output level of the amplifying unit is changed; and a pulling-in circuit for receiving the pulse signal output from the pulse generating circuit, and forcibly pulling the output of the low-pass filter in the high level or the low level.

2. The noise canceling circuit according to claim 1, wherein the pulling-in circuit includes a first transistor interposed between the output of the low-pass filter and a terminal for the high level and a second transistor interposed between the output of the low-pass filter and a terminal for the low level, and an output of the pulse generating circuit is supplied to control terminals of the first and second transistors.

3. The noise canceling circuit according to claim 1, wherein the pulse generating circuit includes a delay circuit for delaying an output of the amplifying unit, an inverting circuit for inverting the output of the amplifying unit, an AND circuit for calculating a logical product between the delay circuit and the inverting circuit, and an OR circuit for calculating a logical sum between the delay circuit and the inverting circuit.

4. The noise canceling circuit according to claim 2, wherein the pulse generating circuit includes a delay circuit for delaying an output of the amplifying unit, an inverting circuit for inverting the output of the amplifying unit, an AND circuit for calculating a logical product between the delay circuit and the inverting circuit, and an OR circuit for calculating a logical sum between the delay circuit and the inverting circuit.

5. The noise canceling circuit according to claim 1, wherein the amplifying unit includes a Schmidt circuit.

6. The noise canceling circuit according to claim 2, wherein the amplifying unit includes a Schmidt circuit.

7. The noise canceling circuit according to claim 3, wherein the amplifying unit includes a Schmidt circuit.

8. The noise canceling circuit according to claim 4, wherein the amplifying unit includes a Schmidt circuit.

* * * * *